(12) United States Patent
Niwa et al.

(10) Patent No.: US 11,164,996 B2
(45) Date of Patent: Nov. 2, 2021

(54) SEMICONDUCTOR LIGHT-EMITTING DEVICE AND METHOD OF MANUFACTURING SEMICONDUCTOR LIGHT-EMITTING DEVICE

(71) Applicant: NIKKISO CO., LTD., Tokyo (JP)

(72) Inventors: Noritaka Niwa, Ishikawa (JP); Tetsuhiko Inazu, Ishikawa (JP)

(73) Assignee: NIKKISO CO., LTD., Tokyo (JP)

(*) Notice: Subject to any disclaimer, the term of this patent is extended or adjusted under 35 U.S.C. 154(b) by 0 days.

(21) Appl. No.: 16/838,468

(22) Filed: Apr. 2, 2020

(65) Prior Publication Data
US 2020/0235265 A1 Jul. 23, 2020

Related U.S. Application Data

(62) Division of application No. 16/111,672, filed on Aug. 24, 2018, now Pat. No. 10,665,751.

(30) Foreign Application Priority Data

Aug. 24, 2017 (JP) .................. 2017-161277

(51) Int. Cl.
*H01L 33/22* (2010.01)
*H01L 33/26* (2010.01)
(Continued)

(52) U.S. Cl.
CPC .............. *H01L 33/22* (2013.01); *H01L 33/26* (2013.01); *H01L 33/0095* (2013.01); *H01L 33/32* (2013.01); *H01L 2933/0083* (2013.01)

(58) Field of Classification Search
CPC .................................................... H01L 33/22
See application file for complete search history.

(56) References Cited

U.S. PATENT DOCUMENTS

2008/0116472 A1 5/2008 Tsunoda
2010/0230671 A1 9/2010 Nakahara et al.
(Continued)

FOREIGN PATENT DOCUMENTS

JP 2012079800 A 4/2012
JP 2014527313 A 10/2014
(Continued)

OTHER PUBLICATIONS

Office Action, with English translation, issued in corresponding JP Patent Application No. 2017-161277, dated Feb. 16, 2021 (9 pages).
(Continued)

*Primary Examiner* — John A Bodnar
(74) *Attorney, Agent, or Firm* — Muncy, Geissler, Olds & Lowe, P.C.

(57) ABSTRACT

A method of manufacturing a semiconductor light-emitting device includes: preparing a layer stack including a light-extracting layer and a light-emitting structure, the light-extracting layer having a first principal surface and a second principal surface opposite to the first principal surface, the light-emitting structure being provided on the first principal surface of the light-extracting layer; forming a pattern mask over a partial region of the second principal surface; dry-etching the second principal surface to form a rugged structure in a region where the pattern mask is formed and to form a recess portion having a planar surface in a region that is exposed without having the pattern mask formed thereover; and singulating the layer stack by irradiating the planar surface with a laser and cutting at least the light-extracting layer at a position of the planar surface.

6 Claims, 6 Drawing Sheets

(51) Int. Cl.
  *H01L 33/00*    (2010.01)
  *H01L 33/32*    (2010.01)

(56)         References Cited

U.S. PATENT DOCUMENTS

2013/0037839 A1    2/2013   Kazama
2014/0209949 A1    7/2014   Chuang et al.
2014/0299901 A1   10/2014   Chi et al.
2016/0163937 A1    6/2016   Inoue et al.
2016/0197235 A1    7/2016   Sung et al.

FOREIGN PATENT DOCUMENTS

JP       2015170710 A      9/2015
JP       2015201488 A     11/2015
JP       2016-46461 A      4/2016
WO    WO-2012176369 A1    12/2012

OTHER PUBLICATIONS

Pernot et al., "Improved Efficiency of 255-280 nm AlGaN-Based Light-Emitting Diodes," The Japan Society of Applied Physics, Jun. 11, 2010, pp. 1-3, 3 pages.
Office Action dated Apr. 27, 2021 in JP Application No. 2017-161277, 8 pages (w/English-translation).

SEMICONDUCTOR LIGHT-EMITTING DEVICE AND METHOD OF MANUFACTURING SEMICONDUCTOR LIGHT-EMITTING DEVICE

RELATED APPLICATION

This application is a Divisional of co-pending application Ser. No. 16/111,672, filed on Aug. 24, 2018, which claims priority of Application No. 2017-161277 filed in Japan on Aug. 24, 2017 under 35 U.S.C. § 119, the entire contents of all of which are hereby incorporated by reference.

BACKGROUND OF THE INVENTION

1. Field of the Invention

The present invention relates to semiconductor light-emitting devices and methods of manufacturing semiconductor light-emitting devices.

2. Description of the Related Art

Nowadays, semiconductor light-emitting devices that emit deep ultraviolet radiation are being developed. A light-emitting device for deep ultraviolet radiation includes an aluminum gallium nitride (AlGaN)-based n-type clad layer, an active layer, and a p-type clad layer that are stacked in this order on a substrate. A rugged structure, such as a moth-eye structure, is formed in a light-extracting surface of the substrate to improve the optical output.

In the process of manufacturing a semiconductor light-emitting device, a large number of device portions are formed in a substrate, and the substrate is then cut to be singulated. In one known singulation method, a substrate is irradiated with a laser beam to form reformed portions inside the substrate, and the substrate is cut at the reformed portions serving as starting points. However, if the laser beam hits the aforementioned rugged structure, the laser beam is scattered by the rugged structure, making it difficult to form the reformed portions. To improve the optical output of a light-emitting device, it is preferable that formation of a rugged structure and singulation through laser reformation can both be achieved favorably.

SUMMARY OF THE INVENTION

The present invention has been made in view of the above and is directed, in one illustrative aim, to providing a technique for increasing a light extraction efficiency of a semiconductor light-emitting device.

A method of manufacturing a semiconductor light-emitting device according to an aspect of the present invention includes: preparing a layer stack including a light-extracting layer and a light-emitting structure, the light-extracting layer having a light-extracting surface in which a rugged structure is provided, the light-emitting structure being provided on a principal surface opposite to the light-extracting surface of the light-extracting layer; forming a mask over the rugged structure in a partial region of the light-extracting surface; forming a planar surface by removing the rugged structure that is exposed without having the mask formed thereover; and singulating the layer stack by irradiating the planar surface with a laser and cutting at least the light-extracting layer at a position of the planar surface.

According to this aspect, since the planar surface formed by partially removing the rugged structure is irradiated with the laser, a reformed portion can be formed favorably through laser irradiation. In addition, since the planar surface is formed by removing the rugged structure, the thickness of the light-extracting layer at the position of the planar surface can be reduced, making it easier to cut the light-extracting layer at the position of the planar surface. Accordingly, possible damage to the light-emitting structure occurring when the layer stack is singulated can be reduced, and a semiconductor light-emitting device with a high light extraction efficiency can be provided.

The rugged structure may have a height of no less than 100 nm, and the planar surface may have an arithmetic mean roughness of no more than 5 nm.

The planar surface may be formed through dry etching.

An etching depth in the forming of the planar surface by removing the rugged structure may be no less than twice the height of the rugged structure.

The light-extracting layer may be one of a sapphire ($Al_2O_3$) layer, an aluminum nitride (AlN) layer, a silicon oxide ($SiO_x$) layer, a silicon nitride ($SiN_x$) layer, and an aluminum oxide ($Al_2O_3$) layer. The light-emitting structure may include an aluminum gallium nitride (AlGaN)-based semiconductor layer that emits ultraviolet radiation at a wavelength of no less than 200 nm nor more than 360 nm.

Another aspect of the present invention provides a method of manufacturing a semiconductor light-emitting element. The method includes: preparing a layer stack including a light-extracting layer and a light-emitting structure, the light-extracting layer having a first principal surface and a second principal surface opposite to the first principal surface, the light-emitting structure being provided on the first principal surface of the light-extracting layer; forming a pattern mask over a partial region of the second principal surface; subjecting the second principal surface to dry etching to form a rugged structure in a region where the pattern mask is formed and to form a recess portion having a planar surface in a region that is exposed without having the pattern mask formed thereover; and singulating the layer stack by irradiating the planar surface with a laser and cutting at least the light-extracting layer at a position of the planar surface.

According to this aspect, the rugged structure and the planar surface can be formed simultaneously in a single dry etching process, and a reformed portion can be formed favorably through the laser irradiation of the planar surface. Since the planar surface is formed by subjecting the second principal surface to dry etching, the thickness of the light-extracting layer at the position of the planar surface can be reduced, making it easier to cut the light-extracting layer at the position of the planar surface. Accordingly, possible damage to the light-emitting structure occurring when the layer stack is singulated can be reduced, and a semiconductor light-emitting device with a high light extraction efficiency can be provided.

Yet another aspect of the present invention provides a semiconductor light-emitting device. The semiconductor light-emitting device includes: a light-extracting layer having a light-extracting surface; and a light-emitting structure provided on a principal surface opposite to the light-extracting surface of the light-extracting layer. The light-extracting surface has an outer peripheral region and an inner region located inward of the outer peripheral region. The outer peripheral region has an arithmetic mean roughness of no more than 5 nm, and the inner region has a rugged structure provided therein having a height of no less than 100 nm. The outer peripheral region is formed to be recessed in a thickness direction of the light-extracting layer with respect to the inner region, and the outer peripheral region and the inner region have an elevation difference of no less than twice the height of the rugged structure.

According to this aspect, since the rugged structure is formed in the inner region of the light-extracting surface, the light extraction efficiency of the semiconductor light-emitting device can be increased. In addition, since the outer peripheral region of the light-extracting surface is planarized and the thickness of the light-extracting layer in the outer peripheral region is small, a structure that can be cut easily at the outer peripheral region by utilizing laser reformation can be provided. Accordingly, possible damage to the light-emitting structure associated with the singulation of the semiconductor light-emitting device can be reduced, and the semiconductor light-emitting device with a high light extraction efficiency can be provided.

DETAILED DESCRIPTION OF THE INVENTION

Figure 1:
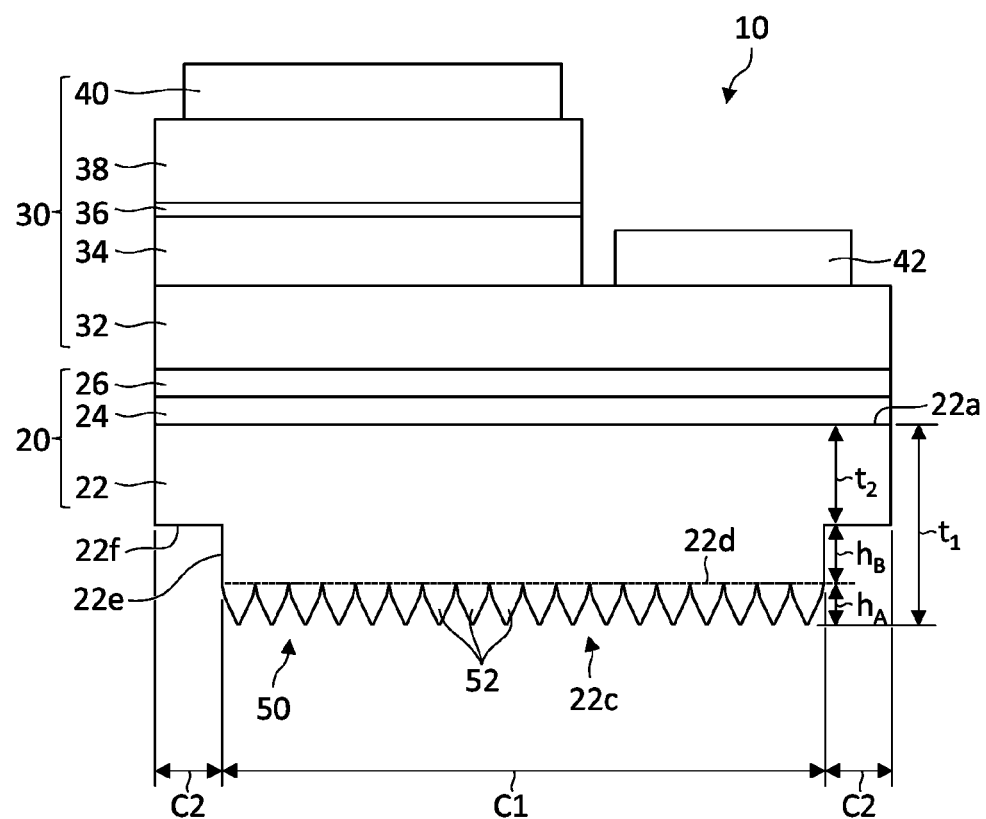
FIG. 1 is a sectional view schematically illustrating a configuration of a semiconductor light-emitting device according to an embodiment.

The invention will now be described by reference to the preferred embodiments. This does not intend to limit the scope of the present invention, but to exemplify the invention.

Hereinafter, embodiments for implementing the present invention will be descried in detail with reference to the drawings. In the descriptions, identical elements are given identical reference characters, and duplicate descriptions thereof will be omitted as appropriate. To help understand the descriptions, the ratios of the dimensions of the constituent elements in the drawings do not necessarily match the ratios of the dimensions of the actual light-emitting device.

FIG. 1 is a sectional view schematically illustrating a configuration of a semiconductor light-emitting device 10 according to an embodiment. The semiconductor light-emitting device 10 includes a base structure 20 and a light-emitting structure 30. The base structure 20 includes a substrate 22, a first base layer 24, and a second base layer 26. The light-emitting structure 30 includes an n-type clad layer 32, an active layer 34, an electron block layer 36, a p-type clad layer 38, a p-side electrode 40, and an n-side electrode 42.

The semiconductor light-emitting device 10 is configured to emit "deep ultraviolet radiation" having a center wavelength of no more than approximately 365 nm. To output deep ultraviolet radiation at such a wavelength, the active layer 34 is composed of an aluminum gallium nitride (AlGaN)-based semiconductor material having a band gap of no less than approximately 3.4 eV. The present embodiment illustrates, in particular, a case in which deep ultraviolet radiation having a center wavelength of no more than approximately 310 nm is emitted.

In the present specification, an "AlGaN-based semiconductor material" refers to a semiconductor material mainly containing aluminum nitride (AlN) and gallium nitride (GaN) and also includes a semiconductor material containing other materials such as indium nitride (InN). As such, the "AlGaN-based semiconductor material" as used in the present specification can be expressed, for example, by the composition $In_{1-x-y}Al_xGa_yN$ ($0 \le x+y \le 1$, $0 \le x \le 1$, $0 \le y \le 1$) and includes AlN, GaN, AlGaN, indium aluminum nitride (InAlN), indium gallium nitride (InGaN), and indium aluminum gallium nitride (InAlGaN).

Of the "AlGaN-based semiconductor materials," a material that is substantially free of AlN may be differentiated and referred to as a "GaN-based semiconductor material." The "GaN-based semiconductor material" mainly includes GaN and InGaN and also includes a material in which a very small amount of AlN is contained in GaN or InGaN. In a similar manner, of the "AlGaN-based semiconductor materials," a material that is substantially free of GaN may be differentiated and referred to as an "AlN-based semiconductor material." The "AlN-based semiconductor material" mainly includes AlN and InAlN and also includes a material in which a very small amount of GaN is contained in AlN or InAlN.

The substrate 22 is a sapphire ($Al_2O_3$) substrate. In a modification, the substrate 22 may be an aluminum nitride (AlN) substrate. The substrate 22 has a principal surface 22a (also referred to as a first principal surface) and a light-extracting surface 22c that is opposite to the first principal surface 22a. The first principal surface 22a is a principal surface that serves as a crystal growing surface and, for example, is a (0001) plane of the sapphire substrate. A fine rugged structure (texture structure) 50 of a submicron order is formed in the light-extracting surface 22c in an inner region C1. A planar surface 22f is formed in the light-extracting surface 22c in an outer peripheral region C2.

The first base layer 24 and the second base layer 26 are stacked on the first principal surface 22a of the substrate 22. The first base layer 24 is formed of an AlN-based semiconductor material and, for example, is a high-temperature-grown AlN (HT-AlN) layer. The second base layer 26 is formed of an AlGaN-based semiconductor material and, for example, is an undoped AlGaN (u-AlGaN) layer.

The substrate 22, the first base layer 24, and the second base layer 26 function as a ground layer (template) for forming the n-type clad layer 32 and the layers thereabove. In addition, the substrate 22, the first base layer 24, and the second base layer 26 also function as a light-extracting layer for extracting deep ultraviolet radiation emitted by the active layer 34 to the outside and transmit the deep ultraviolet radiation emitted by the active layer 34. The first base layer 24 and the second base layer 26 are preferably composed of an AlGaN-based material or an AlN-based material having a higher AlN ratio than the active layer 34 to increase the transmittance of the deep ultraviolet radiation from the active layer 34 and are preferably composed of a material having a lower refractive index than the active layer 34. The first base layer 24 and the second base layer 26 are preferably composed of a material having a higher refractive index than the substrate 22. For example, when the substrate 22 is a sapphire substrate (refractive index $n_1$=approximately 1.8) and the active layer 34 is made of an AlGaN-based semiconductor material (refractive index $n_3$=approximately 2.4 to 2.6), the first base layer 24 and the second base layer 26 are each preferably constituted by an AlN layer (refractive index $n_2$=approximately 2.1) or an AlGaN-based semiconductor material (refractive index $n_2$=approximately 2.2 to 2.3) having a relatively high AlN composition ratio.

The n-type clad layer 32 is an n-type semiconductor layer provided on the second base layer 26. The n-type clad layer 32 is formed of an n-type AlGaN-based semiconductor material and, for example, is an AlGaN layer doped with silicon (Si) serving as an n-type impurity. The composition ratio of the n-type clad layer 32 is selected such that the deep ultraviolet radiation emitted by the active layer 34 is transmitted through the n-type clad layer 32, and the n-type clad layer 32 is formed, for example, to have an AlN molar fraction of no less than 40% or preferably no less than 50%. The n-type clad layer 32 has a band gap greater than the wavelength of the deep ultraviolet radiation emitted by the active layer 34 and is formed, for example, to have a band gap of no less than 4.3 eV. The n-type clad layer 32 has a thickness of approximately 500 nm to 3000 nm or, for example, has a thickness of approximately 2000 nm.

The active layer 34 is formed over a partial region of the n-type clad layer 32. The active layer 34 is formed of an AlGaN-based semiconductor material and, being sandwiched by the n-type clad layer 32 and the electron block layer 36, constitutes a double-heterojunction structure. The active layer 34 may constitute a monolayer or multilayer quantum well structure. Such a quantum well structure is formed, for example, by stacking a barrier layer formed of an undoped AlGaN-based semiconductor material and a well layer formed of an undoped AlGaN-based semiconductor material. The active layer 34 is formed to have a band gap of no less than 3.4 eV so as to output deep ultraviolet radiation at a wavelength of no more than 355 nm, and the AlN composition ratio is selected, for example, to allow the active layer 34 to output deep ultraviolet radiation at a wavelength of no more than 310 nm.

The electron block layer 36 is formed on the active layer 34. The electron block layer 36 is formed of a p-type AlGaN-based semiconductor material and, for example, is an undoped AlGaN layer. The electron block layer 36 is formed, for example, to have an AlN molar fraction of no less than 40% or preferably no less than 50%. The electron block layer 36 may be formed to have an AlN molar fraction of no less than 80% or may be formed of an AlN-based semiconductor material that is substantially free of GaN. The electron block layer 36 may be formed of an AlGaN-based semiconductor material or an AlN-based semiconductor material that is doped with magnesium (Mg) serving as a p-type impurity. The electron block layer 36 has a thickness of approximately 1 nm to 50 nm or, for example, has a thickness of approximately 10 nm to 20 nm.

The p-type clad layer 38 is formed on the electron block layer 36. The p-type clad layer 38 is formed of a p-type AlGaN-based semiconductor material and, for example, is a Mg-doped AlGaN layer. The composition ratio of the p-type clad layer 38 is selected to have a lower AlN molar fraction than the electron block layer 36. The p-type clad layer 38 has a thickness of approximately 100 nm to 1000 nm or, for example, has a thickness of approximately 400 nm to 600 nm.

The p-side electrode 40 is provided on the p-type clad layer 38. The p-side electrode 40 is formed of a material that enables an ohmic contact with the p-type clad layer 38 and is constituted, for example, by a nickel (Ni)/gold (Au) layered structure.

The n-side electrode 42 is provided on the n-type clad layer 32. The n-side electrode 42 is a Ti/Al-based electrode and is constituted, for example, by a titanium (Ti)/Al/Ti/Au or Ti/Al/Ni/Au layered structure.

The rugged structure 50 is formed in the light-extracting surface 22c of the substrate 22. The rugged structure 50 suppresses reflection or total reflection at the light-extracting surface 22c and increases the outer extraction efficiency of the deep ultraviolet radiation output through the light-extracting surface 22c. The rugged structure 50 is formed in substantially the entirety of the light-extracting surface 22c but formed to avoid the outer peripheral region C2 of the light-extracting surface 22c. The rugged structure 50 includes a plurality of frustum-shaped portions 52 formed in the inner region C1 of the light-extracting surface 22c. The frustum-shaped portions 52 are composed of the same material as the substrate 22 and composed, for example, of sapphire ($Al_2O_3$) or aluminum nitride (AlN).

The plurality of frustum-shaped portions 52 are formed to have a substantially uniform height $h_A$. The height $h_A$ of the frustum-shaped portions 52 is no less than 100 nm nor more than 1000 nm or preferably no less than 200 nm nor more than 600 nm. The height $h_A$ of the frustum-shaped portions 52 may vary to some extent (e.g., by approximately 5% to 30%).

The plurality of frustum-shaped portions 52 are arrayed at a predetermined pitch. Herein, the pitch of the frustum-shaped portions 52 is the distance between the vertices of adjacent frustum-shaped portions 52. The frustum-shaped portions 52 are formed to have a pitch of no less than 100 nm nor more than 1000 nm or formed, for example, to have a pitch of no less than 200 nm nor more than 600 nm.

The planar surface 22f is provided in the outer peripheral region C2 of the light-extracting surface 22c. The planar surface 22f is more planer than the rugged structure 50 and is formed, for example, to have an arithmetic mean roughness Ra of no more than 10 nm or preferably no more than 5 nm. The planar surface 22f is formed to be recessed in the thickness direction of the substrate 22 with respect to the rugged structure 50 in the inner region C1, and an elevation difference or a step having a height $h_B$ is provided at a boundary between the inner region C1 and the outer peripheral region C2. The the height $h_B$ from a reference surface 22d corresponding to the bottom surface of the rugged structure 50 to the planar surface 22f is greater than the height $h_A$ of the rugged structure 50 and is preferably no less than twice the height $h_A$ of the rugged structure 50. As such, a thickness $t_2$ of the substrate 22 in the outer peripheral region C2 is smaller than a thickness $t_1$ of the substrate 22 in the inner region C1.

The thickness $t_1$ of the substrate 22 in the inner region C1 is no less than 1 µm and is, for example, approximately 5 µm, 10 µm, 100 µm, 300 µm, or 500 µm. The thickness $t_1$ of the substrate 22 is no less than twice the height $h_A$ of the rugged structure 50 and typically no less than ten times the height $h_A$ of the rugged structure 50. Meanwhile, the thickness $t_2$ of the substrate 22 in the outer peripheral region C2 is no less than 0.5 µm. The difference ($t_1-t_2$) between the thickness of the substrate 22 in the inner region C1 and the thickness thereof in the outer peripheral region C2 is no less than 0.5 µm and, for example, approximately 1 µm, 2 µm, 3 µm, 4 µm, 5 µm, or 10 µm.

A step surface 22e is provided at a boundary portion between the inner region C1 and the outer peripheral region C2 of the substrate 22. The step surface 22e is formed perpendicular to the reference surface 22d of the substrate 22, for example. The step surface 22e may be formed to be inclined relative to the reference surface 22d.

Figure 2:
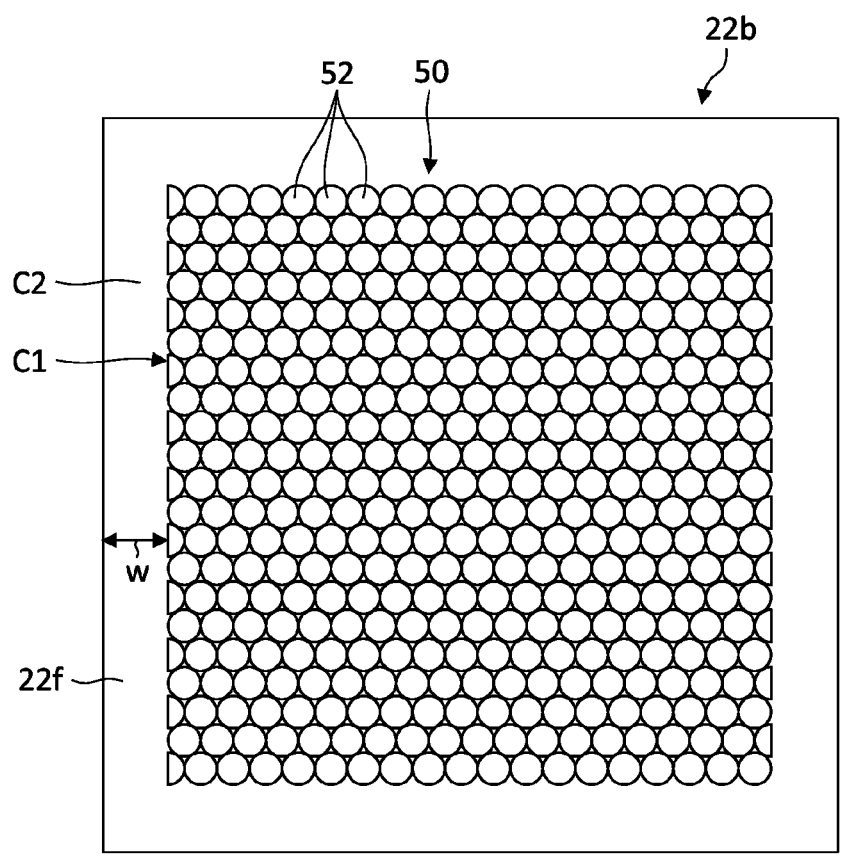
FIG. 2 is a plan view schematically illustrating a configuration of a light-extracting surface of the semiconductor light-emitting device illustrated in FIG. 1.

FIG. 2 is a plan view schematically illustrating a configuration of the light-extracting surface 22c of the semiconductor light-emitting device 10 illustrated in FIG. 1. The light-extracting surface 22c includes the inner region C1 and the outer peripheral region C2. The outer peripheral region C2 is provided in a frame shape along an outer periphery of the light-extracting surface 22c and serves as the planar surface 22f in which no rugged structure 50 is formed. A width w of the outer peripheral region C2 is not particularly limited, and the width w is, for example, in a range of approximately from 1 μm to 50 μm or is, for example, approximately 10 μm to 30 μm. The inner region C1 is located inward of the outer peripheral region C2, and the rugged structure 50 (i.e., the plurality of frustum-shaped portions 52) is provided in the inner region C1.

The plurality of frustum-shaped portions 52 are arrayed two-dimensionally in the inner region C1 of the light-extracting surface 22c and are arrayed, for example, in a triangular lattice pattern as illustrated in FIG. 2. The plurality of frustum-shaped portions 52 are preferably provided to occupy substantially the entirety of the inner region C1 without leaving any gap. The proportion of the area occupied by the plurality of frustum-shaped portions 52 per unit area of the light-extracting surface 22c as viewed from the above is preferably no less than 70%, no less than 80%, or no less than 90%. The frustum-shaped portions 52 each have a circular outline as the light-extracting surface 22c is viewed from the above. To increase the filling factor of the frustum-shaped portions 52 in the inner region C1, the frustum-shaped portions 52 may each have an outline with a shape intermediate between a circle and a polygon or may, for example, have an outline with a shape intermediate between a circle and a hexagon.

Figure 3:
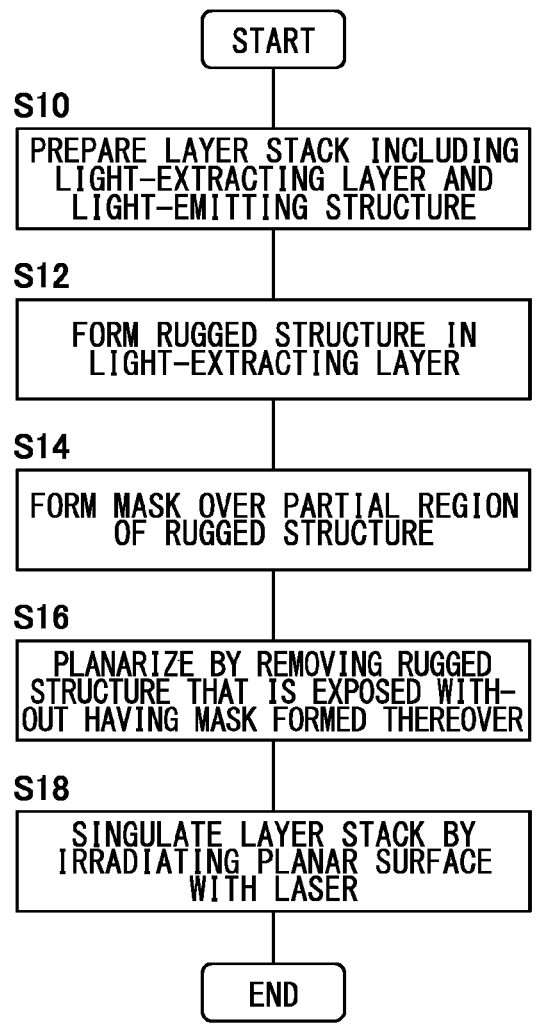
FIG. 3 is a flowchart illustrating a method of manufacturing a semiconductor light-emitting device.

A method of manufacturing the semiconductor light-emitting device 10 will now be described. FIG. 3 is a flowchart illustrating a method of manufacturing the semiconductor light-emitting device 10. First, a layer stack including a light-extracting layer and a light-emitting structure is prepared (S10), and a rugged structure is formed in the light-extracting layer (S12). Then, a mask is formed over a partial region of the rugged structure (S14), and a planar surface is formed by selectively removing the rugged structure that is exposed without having the mask formed thereover (S16). Thereafter, the planar surface is irradiated with a laser to form a reformed portion inside the light-extracting layer, and the light-extracting layer and the light-emitting structure are cut at the reformed portion serving as a starting point to singulate the layer stack into a semiconductor light-emitting device (S18).

Figure 4:
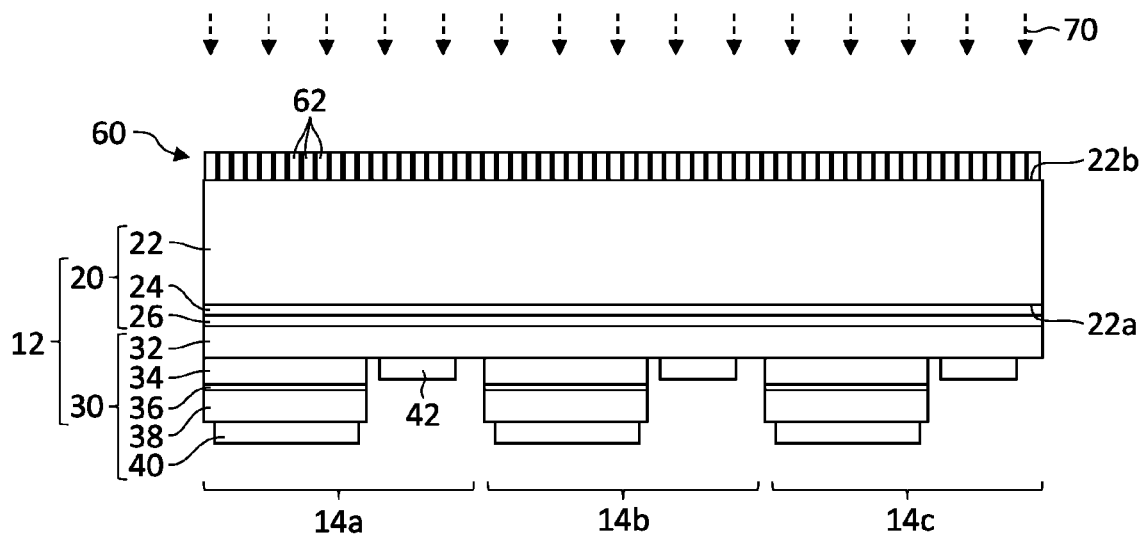
FIG. 4 schematically illustrates a process of manufacturing a semiconductor light-emitting device.

FIG. 4 to FIG. 8 schematically illustrate a process of manufacturing the semiconductor light-emitting device 10. FIG. 4 illustrates a structure of a layer stack 12 including a substrate 22, which is to serve as a light-extracting layer, and a light-emitting structure 30. The layer stack 12 is a structure that has not yet been cut into a plurality of semiconductor light-emitting devices 10 and includes a plurality of device portions 14a, 14b, and 14c provided on the substrate 22.

In preparing the layer stack 12, the substrate 22 with no rugged structure 50 formed therein is prepared, and the first base layer 24, the second base layer 26, the n-type clad layer 32, the active layer 34, the electron block layer 36, and the p-type clad layer 38 are stacked in this order on the first principal surface 22a of the substrate 22. The second base layer 26, the n-type clad layer 32, the active layer 34, the electron block layer 36, and the p-type clad layer 38 that are formed of an AlGaN-based or GaN-based semiconductor material can be formed with the use of a well-known epitaxial growth technique, such as a metalorganic vapor phase epitaxy (MOVPE) technique or a molecular beam epitaxy (MBE) technique.

Next, the active layer 34, the electron block layer 36, and the p-type clad layer 38 that are stacked over the n-type clad layer 32 are partially removed to expose a partial region of the n-type clad layer 32. For example, a mask is formed to avoid a partial region of the p-type clad layer 38, and dry etching is performed with the use of reactive ion etching, plasma, or the like. Thus, the active layer 34, the electron block layer 36, and the p-type clad layer 38 are partially removed, allowing the partial region of the n-type clad layer 32 to be exposed.

The n-side electrode 42 is then formed on the exposed partial region of the n-type clad layer 32, and the p-side electrode 40 is formed on the p-type clad layer 38. Metal layers constituting the p-side electrode 40 and the n-side electrode 42 can be formed, for example, through a well-known method, such as an electron beam vapor deposition technique or a sputtering technique. Thus, the layer stack 12 including the plurality of device portions 14a to 14c can be fabricated.

Thereafter, a first mask 60 is formed on a second principal surface 22b, opposite to the first principal surface 22a, of the substrate 22. The first mask 60 is used to form the rugged structure 50 in the second principal surface 22b and formed over substantially the entirety of the second principal surface 22b. The first mask 60 is a pattern mask having a two-dimensional array pattern that corresponds to the frustum-shaped portions 52 of the rugged structure 50 and includes a plurality of columnar bodies 62 disposed in a two-dimensional array. The plurality of columnar bodies 62 are disposed in a triangular lattice pattern and each have a prism shape or a circular column shape. The columnar bodies 62 may each be slightly tapered and may have a prismoidal shape or a frustconical shape. The first mask 60 is formed, for example, of a resist resin with the use of a nanoimprint technique. The method of forming the first mask 60 is not particularly limited and may be formed with the use of a lithography technique through exposure, electron beam lithography, or the like.

Thereafter, first dry etching 70 is performed over the first mask 60. Reactive ion etching (RIE) can be used as the first dry etching 70, and more specifically plasma etching with inductive coupling plasma (ICP) can be employed. The gas type used in plasma etching is not particularly limited, and a chlorine-based gas, such as chlorine ($Cl_2$) or boron trichloride ($BCl_3$), is preferably used as an etching gas. The use of such an etching gas makes it possible to favorably etch sapphire or aluminum nitride constituting the substrate 22 and a resist resin constituting the first mask 60.

Figure 5:
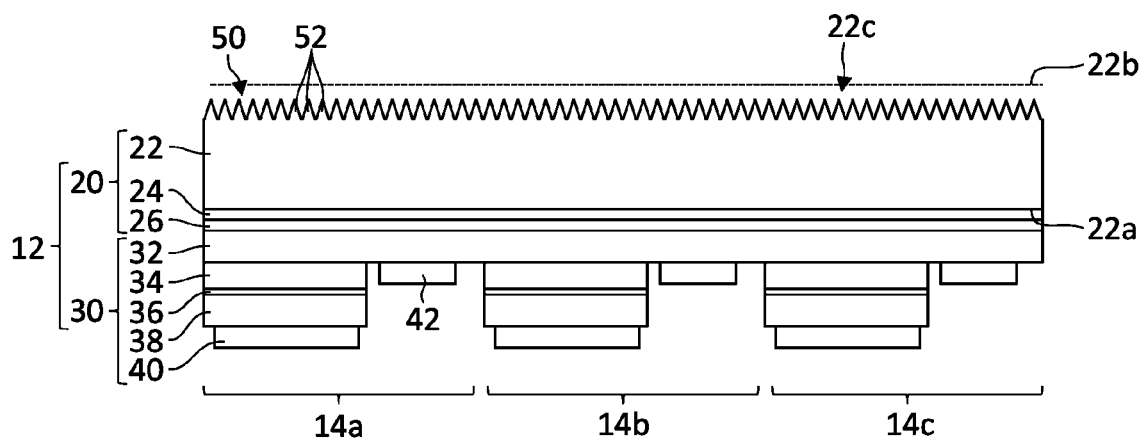
FIG. 5 schematically illustrates a process of manufacturing a semiconductor light-emitting device.

FIG. 5 illustrates a state held after the first dry etching 70 has been performed and illustrates a state in which the light-extracting surface 22c having the rugged structure 50 is formed. In the first dry etching 70, the columnar bodies 62 are isotropically etched from the top and from the side, and the height and the diameter of each columnar body 62 decrease as the etching process progresses. Meanwhile, the second principal surface 22b of the substrate 22 located underneath the first mask 60 is etched at portions that are not covered by the columnar bodies 62. The region covered by each columnar body 62 becomes smaller toward the center of each columnar body 62 over time, and thus the region of the second principal surface 22b that is etched increases over time. Consequently, the etching amount of the second principal surface 22b in its depthwise direction varies in accordance with the distance from the center of each columnar body 62, and the frustum-shaped portions 52 each having an inclined side surface are formed. The height position of the vertices of the frustum-shaped portions 52 is lower than the height of the second principal surface 22b of the substrate 22 upon the completion of the first dry etching 70.

Figure 6:
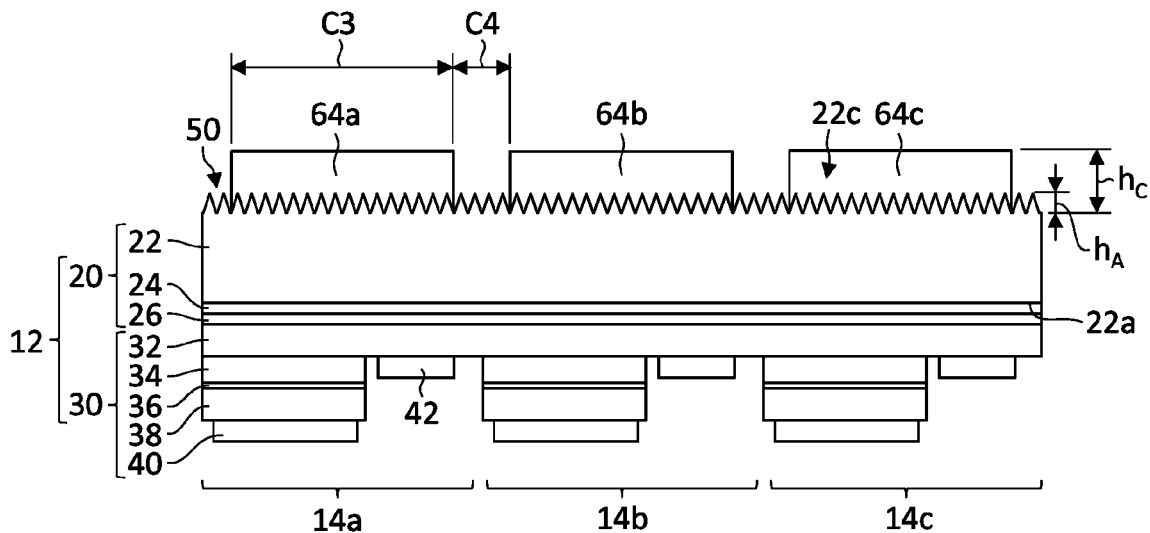
FIG. 6 schematically illustrates a process of manufacturing a semiconductor light-emitting device.

FIG. 6 illustrates a process of forming a second mask 64 (64a, 64b, 64c) over the rugged structure 50. The second mask 64 is selectively provided in a device region C3 corresponding to the inner region C1 of the semiconductor light-emitting device 10 described above and provided to avoid a separation region C4 corresponding to the outer peripheral region C2 of the semiconductor light-emitting device 10. The separation region C4 corresponds to a boundary portion between the plurality of device portions 14a to 14c. The second mask 64 is provided to completely cover the rugged structure 50 in the device region C3 and provided such that the height $h_C$ of the second mask 64 is no less than twice the height $h_A$ of the rugged structure 50 or preferably no less than three times the height $h_A$ of the rugged structure 50. The height $h_C$ of the second mask 64 is, for example, no less than 1 μm or is approximately 2 μm, 3 μm, 4 μm, 5 μm, or 10 μm.

Figure 7:
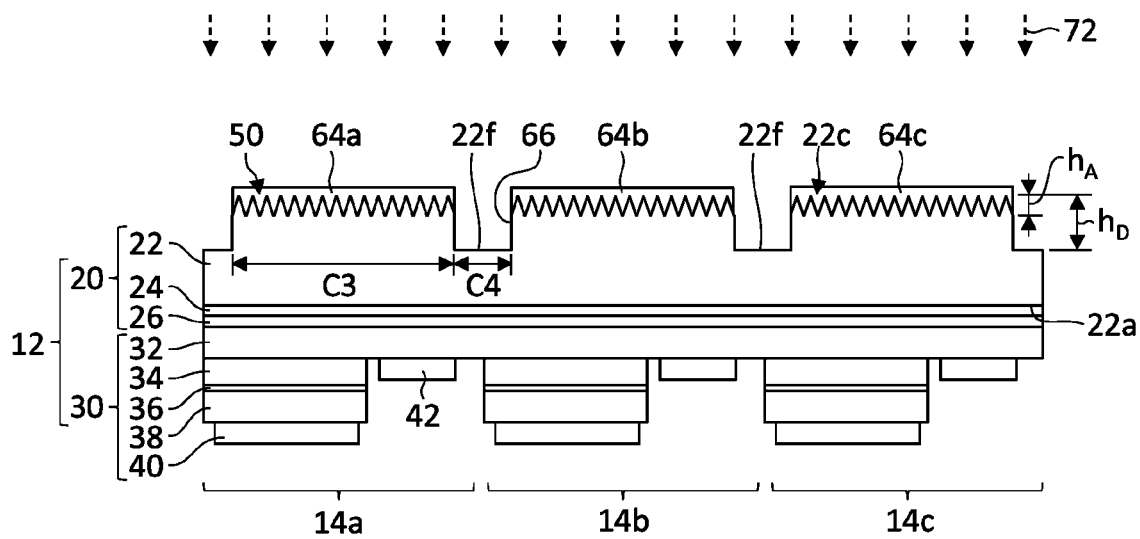
FIG. 7 schematically illustrates a process of manufacturing a semiconductor light-emitting device.

FIG. 7 illustrates a process of removing the rugged structure 50 in the separation region C4 by performing second dry etching 72 over the second mask 64. As illustrated in FIG. 7, the rugged structure 50 is removed through the second dry etching 72 to form a recess portion 66 in the separation region C4 with no second mask 64 formed thereover. At this point, an etching depth $h_D$ of the second dry etching 72 is set to no less than twice the height of the rugged structure 50 or preferably no less than three times the height of the rugged structure 50. Thus, the bottom surface of the recess portion 66 can be planarized, and the planar surface 22f having an arithmetic mean roughness of no more than 10 nm or no more than 5 nm can be formed. Meanwhile, in the device region C3 with the second mask 64 formed thereover, the thickness of the second mask 64 decreases, but the rugged structure 50 is protected by the second mask 64, and the rugged structure 50 remains upon the completion of the second dry etching 72. Upon the completion of the second dry etching 72, the second mask 64 remaining on the rugged structure 50 is removed through a wet process or the like.

Figure 8:
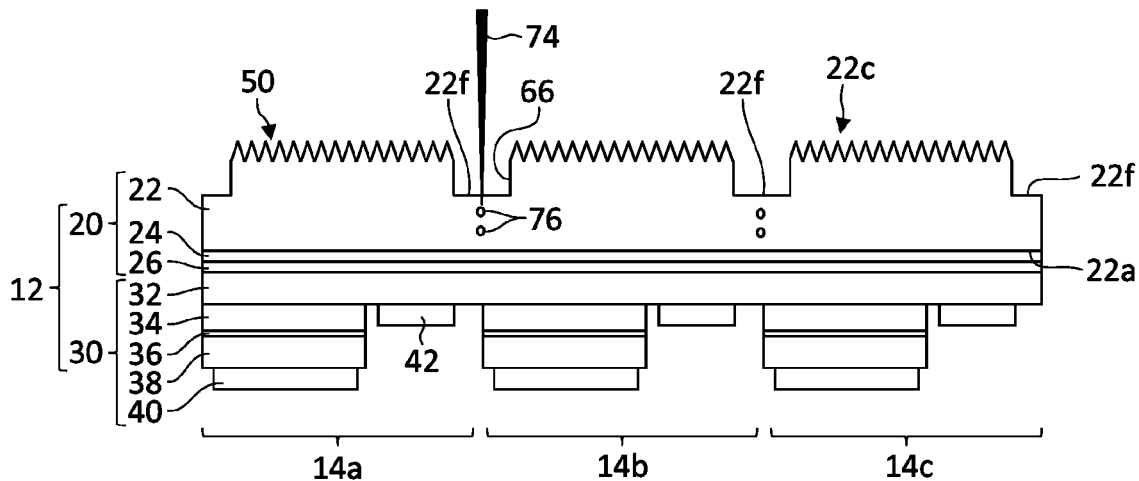
FIG. 8 schematically illustrates a process of manufacturing a semiconductor light-emitting device.

FIG. 8 illustrates a process of forming a reformed portion 76 inside the substrate 22 through irradiation of a laser 74. The reformed portion 76 is formed only inside the substrate 22 as the laser 74 undergoes multiphoton absorption inside the substrate 22. A high-intensity short pulsed laser in a wavelength band transparent to the substrate 22 may be used as the laser 74, for example. The reformed portion 76 is formed in a lattice pattern to enclose each of the device portions 14a to 14c along the separation region C4. Thereafter, the substrate 22 is cut at the reformed portion 76 serving as a starting point, and the device portions 14a to 14c are singulated. Thus, the semiconductor light-emitting device 10 illustrated in FIG. 1 is fabricated.

According to the present embodiment, the light extraction efficiency of the semiconductor light-emitting device 10 can be increased by forming the rugged structure 50 in the light-extracting surface 22c. In addition, the reformed portion 76 can be formed favorably inside the substrate 22 by forming the planar surface 22f in the separation region C4 of the layer stack 12 that has not yet been singulated into the semiconductor light-emitting device 10. If the rugged structure 50 is irradiated with the laser 74, the laser 74 is scattered by the rugged structure 50, and the high-intensity laser beam is not condensed sufficiently, making it difficult to form the reformed portion 76. In addition, a portion of the laser 74 scattered by the rugged structure 50 may hit the light-emitting structure 30 and affect the characteristics of the light-emitting structure 30. In the present embodiment, the surface on which the laser 74 is incident in the separation region C4 is being planarized, and thus scattering of the laser 74 at the incident surface is suppressed, making it possible to form the reformed portion 76 appropriately. Accordingly, possible damage to the light-emitting structure 30 occurring in the singulation process can be reduced, and the semiconductor light-emitting device 10 with a high optical output can be provided.

According to the present embodiment, the recess portion 66 is formed when the planar surface 22f is formed in the separation region C4, and thus the thickness of the substrate 22 in the separation region C4 can be relatively reduced. Accordingly, the substrate 22 can be cut more easily as compared to the case in which the recess portion 66 is not formed. In addition, since the substrate 22 can be cut more easily, no excessive stress needs to be exerted onto the layer stack 12 when the substrate 22 is cut, and possible damage to the light-emitting structure 30 occurring at the time of cutting can be further reduced. Thus, the semiconductor light-emitting device 10 with a higher light extraction efficiency can be provided.

Thus far, the present invention has been described with reference to some embodiments. The present invention is not limited to the foregoing embodiments, and various design changes can be made. It is to be appreciated by a person skilled in the art that various modifications can be made and such modifications are also encompassed by the scope of the present invention.

In the manufacturing method described in the foregoing embodiments, the rugged structure 50 is formed over the entirety of the second principal surface 22b of the layer stack 12, and then the rugged structure 50 in the separation region C4 is partially removed. In a modification, a pattern mask may be formed selectively in the device region C3, and thus the rugged structure 50 may be formed through the pattern mask and simultaneously the recess portion 66 may be formed in the separation region C4.

Figure 9:
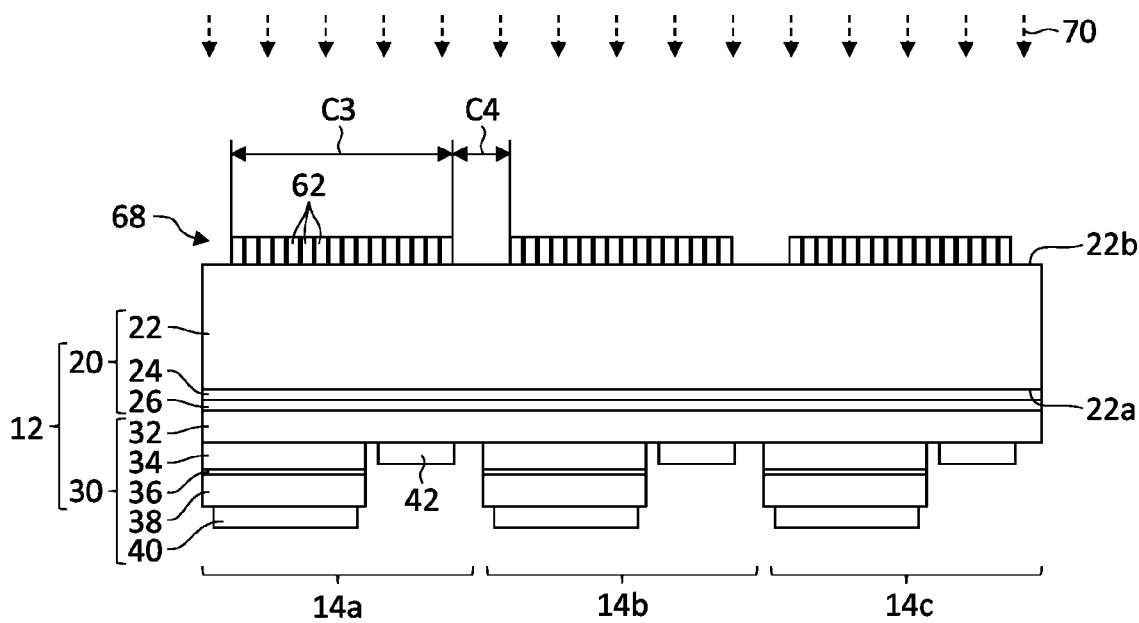
FIG. 9 schematically illustrates a process of manufacturing a semiconductor light-emitting device according to a modification.

FIG. 9 schematically illustrates a process of manufacturing a semiconductor light-emitting device according to a modification. FIG. 9 corresponds to the process illustrated in FIG. 4 according to the foregoing embodiments. In the present modification, a pattern mask 68 having a plurality of columnar bodies 62 is formed selectively in the device region C3, and no pattern mask 68 is formed in the separation region C4. Therefore, the second principal surface 22b is being exposed in the separation region C4 with no pattern mask 68 formed therein. Upon the dry etching 70 being performed in this state, the rugged structure 50 is formed in the device region C3, and the recess portion 66 associated with the planar surface 22f is formed in the separation region C4. Consequently, a structure similar to the light-extracting surface 22c illustrated in FIG. 8 can be fabricated through a single dry etching process. Thereafter, the reformed portion 76 is formed by irradiating the separation region C4 with a laser as illustrated in FIG. 8, the substrate 22 is cut at the reformed portion 76 serving as a starting point, and the device portions 14a to 14c are singulated. In the present modification as well, an advantageous effect similar to that of the foregoing embodiments can be obtained.

In the case illustrated in the foregoing embodiments, the rugged structure 50 is formed in the light-extracting surface 22c of the substrate 22. In a modification, the rugged structure 50 may be formed in another layer formed over the light-extracting surface 22c of the substrate 22. For example, a third base layer may be formed over the light-extracting surface 22c, and the rugged structure 50 may be formed in the third base layer. The third base layer is preferably composed of a material having a refractive index that is lower than that of the active layer 34 and higher than that of the substrate 22 with respect to the wavelength of the deep ultraviolet radiation emitted by the active layer 34. When the substrate 22 is sapphire (refractive index $n_1$=approximately 1.8) and the active layer 34 is an AlGaN-based semiconductor material (refractive index $n_3$=approximately 2.4 to 2.6), the third base layer is preferably composed of AlN (refractive index $n_4$=approximately 2.1) or an AlGaN-based semiconductor material (refractive index $n_4$=approximately 2.2 to 2.3) having a relatively high AlN composition ratio. The third base layer may be composed of silicon nitride ($SiN_x$, refractive index $n_4$=approximately 1.9 to 2.1), silicon oxynitride (SiON), silicon oxide ($SiO_2$), or aluminum oxide ($Al_2O_3$). The third base layer preferably has a high transmittance to the deep ultraviolet radiation emitted by the active layer 34 and is preferably formed to have an internal transmittance of no less than 90%.

In the case illustrated in the foregoing embodiments, the rugged structure 50 and the recess portion 66 are formed in the light-extracting layer after the light-emitting structure 30 is formed. In a further modification, the light-emitting structure 30 may be formed after the rugged structure 50 and the recess portion 66 are formed in the light-extracting layer. For example, a substrate 22 in which the rugged structure 50 and the recess portion 66 are formed in advance may be prepared, and the light-emitting structure 30 may be formed on this substrate.

It should be understood that the invention is not limited to the above-described embodiments, but may be modified into various forms on the basis of the spirit of the invention. Additionally, the modifications are included in the scope of the invention.

What is claimed is:

1. A method of manufacturing a semiconductor light-emitting device, the method comprising:
   preparing a layer stack including a light-extracting layer and a light-emitting structure, the light-extracting layer having a first principal surface and a second principal surface opposite to the first principal surface, the light-emitting structure being provided on the first principal surface of the light-extracting layer;
   forming a pattern mask over a partial region of the second principal surface;
   dry-etching the second principal surface to form a rugged structure of the light-extracting layer in a region where the pattern mask is formed and to form a recess portion having a planar surface of the light-extracting layer in a region that is exposed without having the pattern mask formed thereover;
   radiating a laser onto the planar surface; and
   singulating the layer stack by cutting at least the light-extracting layer at a position of the planar surface.

2. The method of manufacturing a semiconductor light-emitting device according to claim 1, wherein
   the rugged structure has a height of no less than 100 nm, and
   the planar surface has an arithmetic mean roughness of no more than 5 nm.

3. The method of manufacturing a semiconductor light-emitting device according to claim 1, wherein
   the rugged structure and the planar surface are simultaneously formed in the dry etching.

4. The method of manufacturing a semiconductor light-emitting device according to claim 1, wherein
   an etching depth in the dry-etching is no less than twice the height of the rugged structure.

5. The method of manufacturing a semiconductor light-emitting device according to claim 1, wherein
   the light-extracting layer is one of a sapphire ($Al_2O_3$) layer, an aluminum nitride (AlN) layer, a silicon oxide ($SiO_x$) layer, a silicon nitride ($SiN_x$) layer, and an aluminum oxide ($Al_2O_3$) layer, and
   the light-emitting structure includes an aluminum gallium nitride (AlGaN)-based semiconductor layer that emits ultraviolet radiation at a wavelength of no less than 200 nm nor more than 360 nm.

6. The method of manufacturing the semiconductor light-emitting device according to claim 1, wherein
   a reformed portion is formed inside the light-extracting layer by radiating the laser, and
   the light-extracting layer is cut at the reformed portion serving as a starting point.

* * * * *